United States Patent
Rothberg et al.

(10) Patent No.: US 10,497,856 B2
(45) Date of Patent: Dec. 3, 2019

(54) ELECTRICAL CONTACT ARRANGEMENT FOR MICROFABRICATED ULTRASONIC TRANSDUCER

(71) Applicant: Butterfly Network, Inc., Guilford, CT (US)

(72) Inventors: Jonathan M. Rothberg, Guilford, CT (US); Susan A. Alie, Stoneham, MA (US); Jaime Scott Zahorian, Guilford, CT (US); Paul Francis Cristman, New Haven, CT (US); Keith G. Fife, Palo Alto, CA (US)

(73) Assignee: Butterfly Network, Inc., Guilford, CT (US)

( * ) Notice: Subject to any disclaimer, the term of this patent is extended or adjusted under 35 U.S.C. 154(b) by 344 days.

(21) Appl. No.: 15/626,330

(22) Filed: Jun. 19, 2017

(65) Prior Publication Data

US 2017/0365774 A1    Dec. 21, 2017

Related U.S. Application Data

(60) Provisional application No. 62/352,394, filed on Jun. 20, 2016.

(51) Int. Cl.
| | |
|---|---|
| H01L 41/04 | (2006.01) |
| B06B 1/02 | (2006.01) |
| H01L 41/27 | (2013.01) |
| B06B 1/06 | (2006.01) |
| H01L 41/047 | (2006.01) |
| H05K 3/36 | (2006.01) |

(52) U.S. Cl.
CPC ............... *H01L 41/27* (2013.01); *B06B 1/06* (2013.01); *H01L 41/047* (2013.01); *H05K 3/361* (2013.01); *H05K 2201/10977* (2013.01); *H05K 2203/0726* (2013.01)

(58) Field of Classification Search
CPC ... H01L 41/27; H01L 41/047; B06B 81/0292; B06B 1/06; B06B 1/0622; H05K 3/361; H05K 2201/10977; H05K 2203/0726
USPC ....................................................... 310/334
See application file for complete search history.

(56) References Cited

U.S. PATENT DOCUMENTS

| | | | |
|---|---|---|---|
| 6,262,946 B1 | 7/2001 | Khuri-Yakub et al. |
| 6,430,109 B1 | 8/2002 | Khuri-Yakub et al. |
| 6,958,255 B2 | 10/2005 | Khuri-Yakub et al. |
| 7,321,181 B2 | 1/2008 | Khuri-Yakub et al. |
| 7,615,834 B2 | 11/2009 | Khuri-Yakub et al. |

(Continued)

OTHER PUBLICATIONS

International Search Report and Written Opinion dated Sep. 1, 2017 in connection with International Application No. PCT/US2017/038105.

(Continued)

*Primary Examiner* — Thomas M Dougherty
(74) *Attorney, Agent, or Firm* — Wolf, Greenfield & Sacks, P.C.

(57) ABSTRACT

An ultrasound-on-a-chip device has an ultrasonic transducer substrate with plurality of transducer cells, and an electrical substrate. For each transducer cell, one or more conductive bond connections are disposed between the ultrasonic transducer substrate and the electrical substrate. Examples of electrical substrates include CMOS chips, integrated circuits including analog circuits, interposers and printed circuit boards.

14 Claims, 7 Drawing Sheets

(56) References Cited

U.S. PATENT DOCUMENTS

| | | | |
|---|---|---|---|
| 9,067,779 | B1 | 6/2015 | Rothberg et al. |
| 9,242,275 | B2 | 1/2016 | Rothberg et al. |
| 2003/0028108 | A1* | 2/2003 | Miller ............... A61B 8/4483 600/437 |
| 2007/0215964 | A1 | 9/2007 | Khuri-Yakub et al. |
| 2007/0262436 | A1 | 11/2007 | Kweon et al. |
| 2008/0315331 | A1* | 12/2008 | Wodnicki ............ B06B 1/0629 257/414 |
| 2011/0071397 | A1 | 3/2011 | Wodnicki et al. |
| 2011/0115333 | A1* | 5/2011 | Ezaki ................. B06B 1/0292 310/300 |
| 2012/0133001 | A1 | 5/2012 | Tkaczyk et al. |
| 2013/0169110 | A1 | 7/2013 | Jeong et al. |
| 2013/0331705 | A1 | 12/2013 | Fraser |
| 2014/0139072 | A1* | 5/2014 | Sudol ................. B06B 1/0622 310/334 |
| 2014/0183731 | A1 | 7/2014 | Lin et al. |
| 2014/0217478 | A1 | 8/2014 | Rothberg et al. |
| 2014/0219062 | A1 | 8/2014 | Rothberg et al. |
| 2015/0156571 | A1 | 6/2015 | Shim et al. |
| 2015/0175406 | A1 | 6/2015 | Lin et al. |
| 2016/0009544 | A1 | 1/2016 | Rothberg et al. |
| 2016/0379973 | A1* | 12/2016 | Rothberg ............ A61B 8/4494 438/53 |
| 2018/0180724 | A1* | 6/2018 | Zhang ..................... G01S 7/521 |
| 2019/0015871 | A1* | 1/2019 | Savord ................ B06B 1/0292 |

OTHER PUBLICATIONS

PCT/US2017/038105, Jan. 3, 2019, International Preliminary Report on Patentabiliy.

Cha et al., Influences of perforation ratio in characteristics of capacitive micromachined ultrasonic transducers in air. Sensors Actuators A. 2011;171:191-8.

Khuri-Yakub et al., Miniaturized Ultrasound Imaging Probes Enabled by CMUT Arrays with Integrated Frontend Electronic Circuits. Conf Proc IEEE Eng Med Biol Soc. 2010;1:5987-90. doi:10.1109/IEMBS.2010.5627580. Epub Dec. 6, 2010. 13 pages.

Manzanares et al., Air-coupled MUMPs capacitive micromachined ultrasonic transducers with resonant cavities. Ultrason. 2012;52:482-9.

Zhuang et al., Integration of trench-isolated through-wafer interconnects with 2d capacitive micromachined ultrasonic transducer arrays. Sensors Actuators A. 2007;138:221-9.

Zhuang et al., Wafer-bonded 2-D CMUT arrays incorporating through-wafer trench-isolated interconnects with a supporting frame. IEEE Trans Ultrason Ferroelectr Freq Control. Jan. 2009;56(1):182-92. doi: 10.1109/TUFFC.2009.1018.

International Preliminary Report on Patentability dated Jan. 3, 2019 in connection with International Application No. PCT/US2017/038105.

* cited by examiner

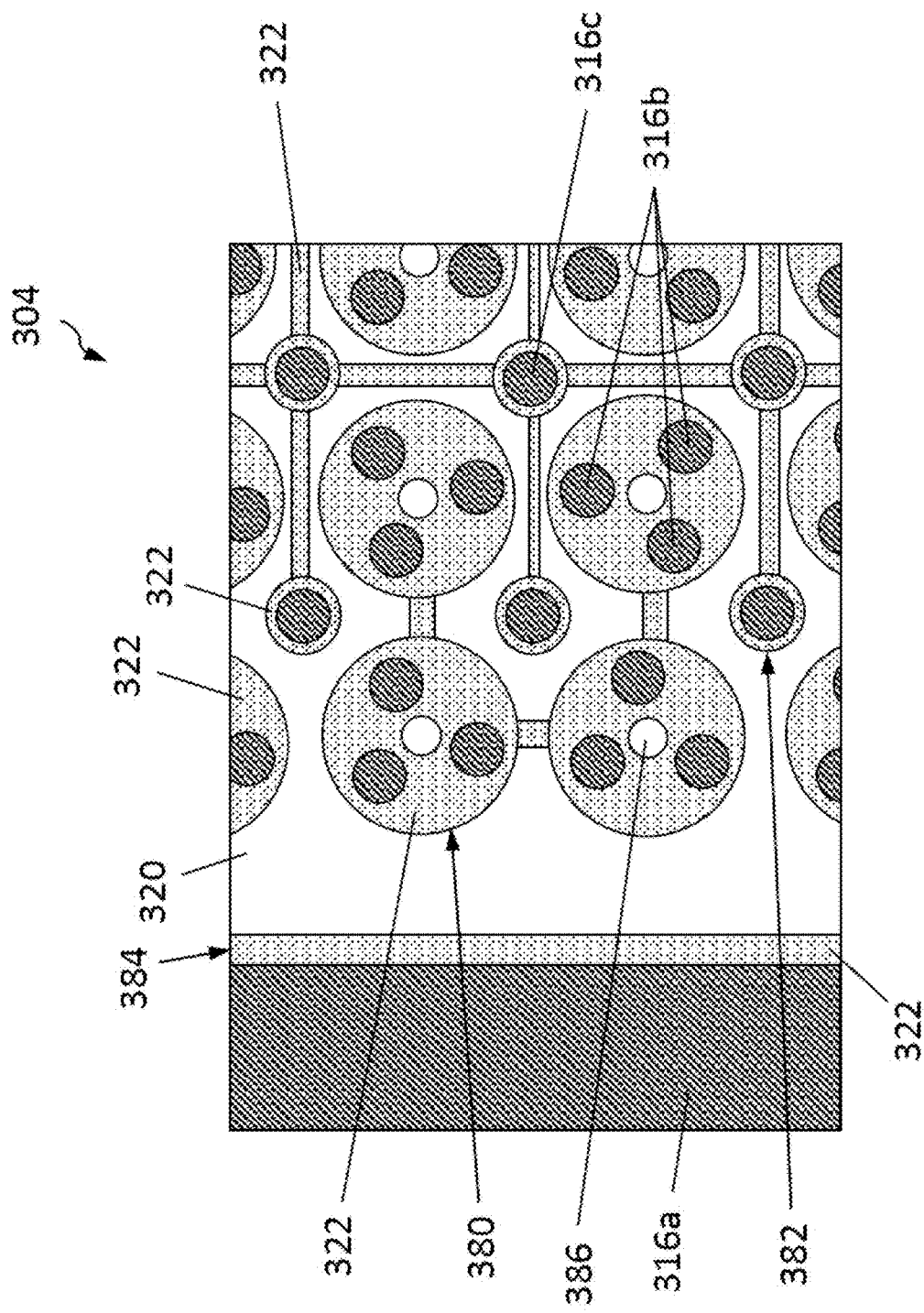

ELECTRICAL CONTACT ARRANGEMENT FOR MICROFABRICATED ULTRASONIC TRANSDUCER

CROSS-REFERENCE TO RELATED APPLICATIONS

This application claims the benefit under 35 U.S.C. § 119(e) of U.S. Provisional Patent Application Ser. No. 62/352,394, filed Jun. 20, 2016, and entitled "ELECTRICAL CONTACT ARRANGEMENT FOR MICROFABRICATED ULTRASONIC TRANSDUCER," which is hereby incorporated herein by reference in its entirety.

BACKGROUND

The present disclosure relates generally to ultrasound imaging. In particular, the present disclosure relates to Capacitive Micromachined Ultrasonic Transducers (CMUTs) that are integrated with complementary metal oxide semiconductor (CMOS) circuits, and methods for forming the same.

CMUTs are known devices that include a membrane above a micromachined cavity. The membrane may be used to transduce an acoustic signal into an electric signal, or vice versa. Thus, CMUTs can operate as ultrasonic transducers.

Many different types of images can be formed using ultrasound devices. The images can be real-time images. For example, images can be generated that show two-dimensional cross-sections of tissue, blood flow, motion of tissue over time, the location of blood, the presence of specific molecules, the stiffness of tissue, or the anatomy of a three-dimensional region.

Two types of processes can be used to fabricate CMUTs. One approach involves a sacrificial layer process to form the membrane of the CMUT on a first substrate above a sacrificial layer. Removal of the sacrificial layer results in the membrane being suspended above a cavity. In another approach, a wafer bonding process bonds two wafers together to form a cavity with a membrane.

SUMMARY

In one exemplary embodiment, an apparatus includes an ultrasound-on-a-chip device having an ultrasonic transducer substrate having plurality of transducer cells disposed proximate a first side of the ultrasonic transducer substrate, and for each transducer cell, one or more conductive bond connections disposed between a second side of the ultrasonic transducer substrate and an electrical substrate.

In another embodiment, an ultrasound device includes a composite substrate having first and second substrates bonded together to define a plurality of cavities between them, each cavity corresponding to an ultrasound transducer cell; and an electrical substrate bonded to the composite substrate by a plurality of conductive bond points, wherein each transducer cell has one or more conductive bond connections disposed between the ultrasonic transducer substrate and the electrical substrate.

In another embodiment, a method of forming an ultrasound device includes bonding first and second substrates bonded together to define a composite substrate having a plurality of cavities therein, each cavity corresponding to an ultrasound transducer cell; and bonding an electrical substrate to the composite substrate with a plurality of conductive bond points, wherein each transducer cell has one or more conductive bond connections disposed between the ultrasonic transducer substrate and the electrical substrate.

BRIEF DESCRIPTION OF THE DRAWINGS

Various aspects and embodiments of the disclosed technology will be described with reference to the following Figures. It should be appreciated that the figures are not necessarily drawn to scale. Items appearing in multiple figures are indicated by the same reference number in all the figures in which they appear.

FIG. 3D is a top-down view taken along the arrows "D" of FIG. 3A illustrating the location of conductive contacts in both FIG. 3A and FIG. 3B with respect to metal regions of the CMOS wafer, according to a non-limiting embodiment of the present application;

DETAILED DESCRIPTION

Figure 1:
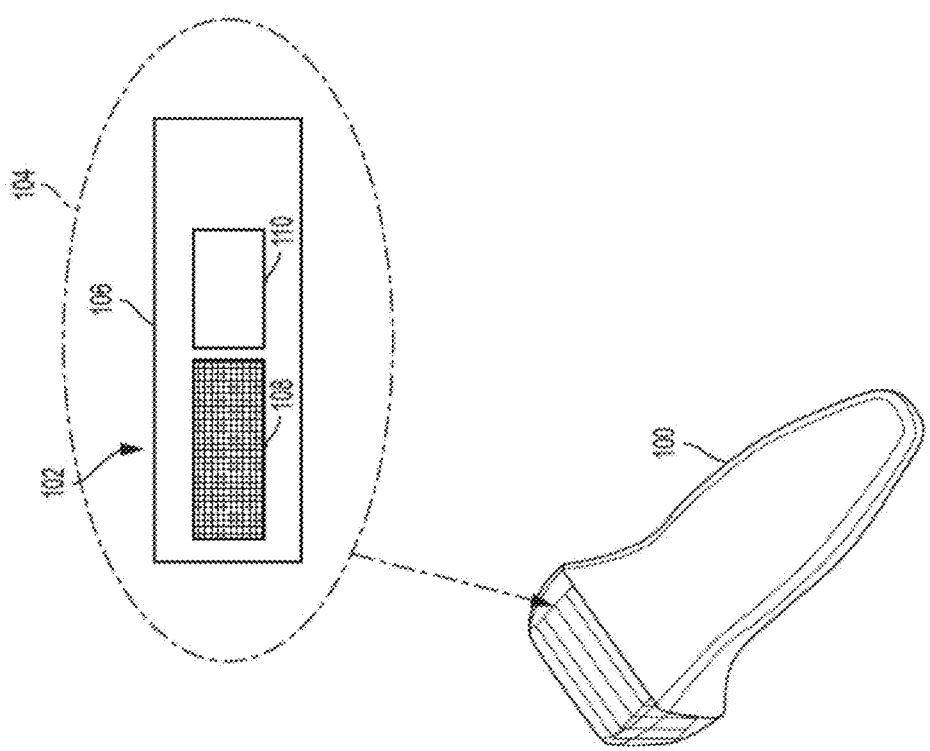
FIG. 1 illustrates an ultrasound probe with a simplified schematic of an ultrasound-on-a-chip device that may be used in the probe, having ultrasonic transducers integrated with an integrated circuit (IC), according to a non-limiting embodiment of the present application.

Integration of ultrasonic transducers with electrical substrates includes bonding a substrate having an arrangement (e.g., an array) of individual ultrasonic transducers (e.g., a substrate having a plurality of capacitive micromachined ultrasonic transducers, or CMUTs) to another substrate having some electrical functionality to produce an ultrasound device. For example, the electrical substrate may be an interposer, a printed circuit board (pcb), an application specific circuit (ASIC) substrate, a substrate with analog circuitry, a substrate having integrated CMOS circuitry (a CMOS substrate), or any other substrate with electrical functionality. Multiple bonding points may be provided between a single ultrasonic transducer and the electrical substrate, providing beneficial mechanical support and facilitating mechanical and electrical integration between the ultrasonic transducer substrate (e.g., a CMUT wafer) and the electrical substrate. In some embodiments, an electrical contact is provided between the electrical substrate and an acoustically inactive area representing dead space on the ultrasonic transducer substrate. This electrical contact may be used to increase the signal-to-noise ratio (SNR) of signals read out from the ultrasonic transducers, to provide mechanical support for the overall structure, to bias the acoustically inactive area and/or to improve manufacturability through utilization of a uniform pattern of metal features. These features may facilitate integration of the ultrasonic transducers with the electrical substrate, and thus may be used to make an ultrasound-on-a-chip device.

The term "SOI wafer" as used herein has its conventional meaning, including a silicon handle layer, a buried oxide (BOX) layer, and a silicon device layer separated from the handle layer by the BOX layer.

The term "engineered substrate" as used herein refers to a substrate engineered to differ from a basic silicon wafer or standard SOI wafer. An engineered substrate may also be a "composite substrate" formed by combining multiple distinct elements (e.g., multiple distinct wafers). An engineered substrate may also incorporate patterned features and provide device functionality, as is described in further detail in U.S. Pat. No. 9,067,779 and U.S. Patent Application Publication 2016/0009544, both of which are incorporated herein by reference in their entireties.

Throughout this disclosure, the use of the term "approximately" includes "exactly" unless context dictates otherwise. For example, describing a distance as being less than approximately 10 microns ($\mu$m) is to be understood to include the scenario in which the distance is less than 10 $\mu$m, and describing a distance as being approximately 10 $\mu$m is to be understood to include the scenario in which the distance is equal to 10 $\mu$m.

An ultrasound-on-a-chip device includes micromachined ultrasound transducers integrated with integrated circuitry, and can be made by bonding a substrate or wafer, and/or an engineered substrate/wafer having ultrasonic transducers with an electrical substrate, such as a substrate having analog circuitry, CMOS circuitry or other types of integrated circuits (IC), a printed circuit board, or an interposer (e.g., a silicon interposer). Utilizing a bond pattern that includes multiple electrically conductive bond points between a single ultrasonic transducer and the electrical substrate can increase the adequacy of the bond, and therefore improve manufacturing yield. Such a bond pattern may also improve the structural integrity of the ultrasound-on-a-chip device by shortening the distance between bond points of neighboring ultrasonic transducers.

In some embodiments, the bond pattern between the ultrasonic transducer substrate and the electrical substrate may include an electrical connection between the electrical substrate and dead space of the ultrasonic transducer substrate. At least some ultrasonic transducers of the ultrasonic transducer substrate may be separated by regions of a conductive material that are not positioned be part of the transduction performed by the transducers. For instance, the transducers may include electrodes formed from a conductive material that extends outside the region of transduction. Because these regions do not contribute to the transduction of the ultrasonic transducers (i.e., they are acoustically inactive) they may be considered dead space of the ultrasonic transducer substrate. Nonetheless, there may be multiple benefits realized by providing an electrical contact to these regions.

As one example, the acoustically inactive regions may experience electrical noise similar to or the same as the ultrasonic transducers. Including an electrical connection between the IC (or other types of electrical substrates) and the dead space region(s) of the ultrasonic transducer substrate may allow for biasing the acoustically inactive region, which for example may be used to reduce noise and/or parasitic capacitance of the region. In some embodiments, such an electrical contact may allow use of the acoustically inactive portion as a sense node, allowing for detection of the electrical noise, which may then be removed from the desired ultrasonic transducer signals, improving performance of the ultrasound-on-a-chip device. Such electrical connections may be included in the bond pattern between the ultrasonic transducer substrate and the electrical substrate. Another potential benefit of such an electrical connection is that it may make the resulting pattern of metal features on a CMOS wafer more uniform, or substantially uniform, thus helping to maintain planarity of the device through chemical mechanical polishing (CMP) stages performed on the IC wafer. Also, the electrical contacts may also provide mechanical support to the acoustically inactive regions, and thus to the ultrasound device overall. In some embodiments, the size and/or shape and/or position of these inactive regions may be standardized irrespective of the design of the cells. As such, the same set of masks and/or process steps may be used for different devices even if the cells in these devices are arranged differently.

Thus, aspects of the present application include ultrasonic transducer fabrication designs and techniques that facilitate manufacture and operation of ultrasound-on-a-chip devices.

The aspects and embodiments described above, as well as additional aspects and embodiments, are described further below. These aspects and/or embodiments may be used individually, all together, or in any combination of two or more, as the application is not limited in this respect.

FIG. 1 illustrates an ultrasound probe with a simplified schematic of an ultrasound-on-a-chip device that may be used in the probe. The probe 100 may be a handheld probe configured to plug into a computer, smartphone, tablet, or other external device, or to communicate wirelessly with such a device. The probe 100 may include an ultrasound-on-a-chip device 102, shown in the call-out view 104. The ultrasound-on-a-chip device 102 may include a substrate 106 with integrated ultrasonic transducers 108 and circuitry 110. For ease of illustration, the schematic view of FIG. 1 shows the ultrasonic transducers 108 and circuitry 110 as simplified blocks in a side-by-side configuration. As is illustrated in subsequent figures, and described further below, the physical implementation may have the ultrasonic transducers and circuitry in a stacked configuration. The substrate 106 may be a semiconductor substrate, such as a silicon or silicon-on-insulator (SOI) substrate, and in some embodiments is a complementary metal oxide semiconductor (CMOS) substrate. The ultrasonic transducers 108 may be capacitive micromachined ultrasonic transducers (CMUTs) and the circuitry 110 may be integrated circuitry, such as silicon circuitry.

In the simplified representation of call-out view 104, the ultrasonic transducers 108 and circuitry 110 are schematically depicted as being side-by-side for purposes of illustration. In practice, such a side-by-side configuration is physically possible on a substrate, but so are alternatives. Embodiments of the present application relate to a configuration in which the substrate 106 is formed by bonding an engineered substrate having ultrasonic transducers with a substrate having an IC (or other electrical substrates, such as silicon interposers or other types of interposers, or printed circuit boards), such that the ultrasonic transducers and IC may be in a stacked configuration. Such a configuration is conceptually and schematically shown in FIG. 2.

Figure 2:
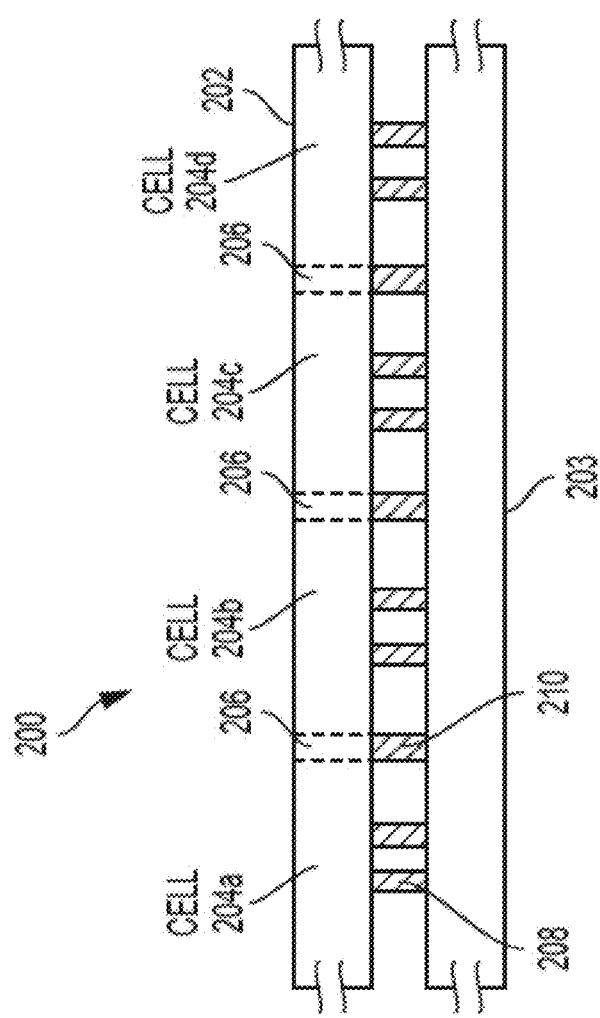
FIG. 2 is a simplified schematic illustration of an ultrasound-on-a-chip device having an ultrasonic transducer substrate bonded with an integrated circuit substrate with multiple bonds between an ultrasonic transducer cell and the integrated circuit as well as an electrical connection between dead space of the ultrasonic transducer substrate and the integrated circuit, according to a non-limiting embodiment of the present application.

The ultrasound-on-a-chip device 200 of FIG. 2 includes an ultrasonic transducer substrate 202 bonded with an IC substrate 203. It should be appreciated that ultrasonic transducer substrates of the types described herein are not limited to being bonded with IC substrates, as they may be bonded with any other type of electrical substrate. The substrates may be wafers, and the figure illustrates a part of each substrate, as can be appreciated from the broken boundary lines. The ultrasonic transducer substrate 202 includes a plurality of ultrasonic transducers, also referred to herein as "ultrasonic transducer cells" or simply "cells" 204a, 204b, 204c, 204d, etc. In practice, a large number of such cells may be provided, such as hundreds, thousands, tens of thousands, or millions, and the various aspect of the application are not limited in this respect. Four ultrasonic transducer cells are shown for simplicity. Ultrasonic transducer cells may be electrically grouped to form an "ultrasound element." That is, an ultrasound element may include two or more ultrasonic transducers electrically coupled to effectively operate as a single larger ultrasonic transducer. The ultrasonic transducer cells 204a-204d may each include a capacitive ultrasonic transducer, such as a CMUT. In addition, there may be an acoustic dead space 206 between at least some of the ultrasonic transducer cells. As an example, each of the cells 204a-204d may include an electrically conductive portion, for instance a bottom electrode, corresponding to a cavity of the cell. The dead space 206 may represent a portion of the same material forming the electrode, but not aligned with the cavity of the cell, and thus substantially not involved in the transduction of the cell. In some cases this acoustic "dead space" is separated from the transducer cavity by a filled trench such that the dead space is mechanically and electrically isolated from the transducer cell.

As shown, the ultrasound-on-a-chip device 200 includes multiple, distinct physical and electrical contacts 208 between the ultrasonic transducer cells and the IC substrate 203. These contacts may be electrically conductive, and may represent bond points between the ultrasonic transducer substrate 202 and the IC substrate 203. Although two contacts 208 are shown for each of the cells 204a-204d in the exemplary embodiment depicted, it will be appreciated that other numbers are possible and it is not necessary that the same number of contacts be provided between each cell and the IC substrate. As will be understood from a later description of FIG. 3B, in some embodiments three contacts may be provided between an ultrasonic transducer cell and the IC substrate. FIG. 2 is a cross-sectional view, and thus additional contacts 208 may be provided in a plane closer than or farther than the plane of the page, as a non-limiting example. In addition, while the figures depict contacts with circular cross sections, other shapes or configurations for the contacts (such as rings or grids for example) may also be used.

The ultrasound-on-a-chip device 200 also includes contacts 210 between the dead space 206 and the IC substrate 203. The contacts 210 may be electrically conductive and may represent bond points between the ultrasonic transducer substrate 202 and the IC substrate 203. Multiple contacts 210 may be provided between a dead space region and the IC substrate 203. It will be noted that the schematic view of FIG. 2 does not depict the insulating trenches which surround both individual transducer cells as well as the dead space regions.

Figure 3A:
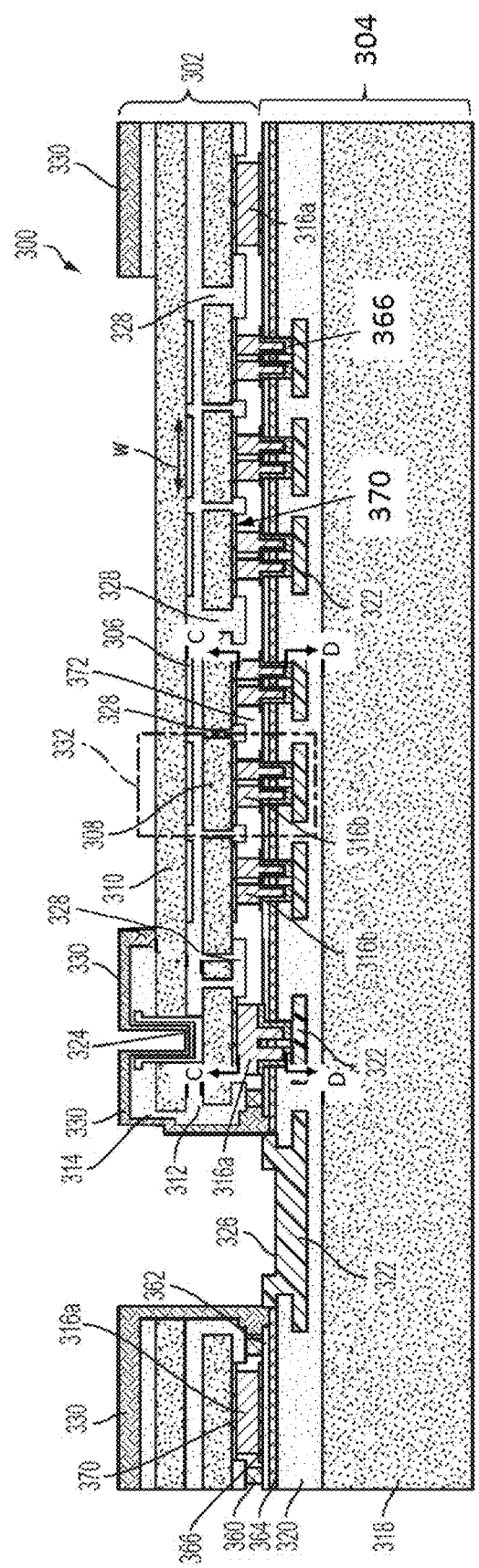
FIG. 3A is a cross-sectional view taken along the line A-A of FIG. 3C, illustrating an active transducer region of an ultrasound-on-a-chip device including a CMOS wafer integrated with an engineered substrate having sealed cavities, according to a non-limiting embodiment of the present application.

FIG. 3A is an exemplary cross sectional view of a detailed implementation of portion of the ultrasound-on-a-chip device 200 schematically represented in FIG. 2. More specifically, FIG. 3A is a cross-sectional view of an ultrasound device 300 including a CMOS wafer integrated with an engineered substrate having sealed cavities, according to a non-limiting embodiment of the present application, and includes multiple contacts formed between the CMOS wafer and an ultrasonic transducer of the engineered substrate.

The device 300 includes an engineered substrate 302 integrated with a CMOS wafer 304. The engineered substrate 302 includes a plurality of cavities 306 formed between a first silicon device layer 308 and a second silicon device layer 310. A silicon oxide layer 312 (e.g., a thermal silicon oxide formed by thermal oxidation of silicon) may be formed between the first and second silicon device layers 308 and 310, with the cavities 306 being formed therein. In this non-limiting example, the first silicon device layer 308 may be configured as a bottom electrode and the second silicon device layer 310 may be configured as a membrane. Thus, the combination of the first silicon device layer 308, second silicon device layer 310, and cavities 306 may form an ultrasonic transducer (e.g., a CMUT), of which six are illustrated in this non-limiting cross-sectional view. To facilitate operation as a bottom electrode or membrane, one or both of the first silicon device layer 308 and second silicon device layer 310 may be doped to act as conductors, and in some cases are highly doped (e.g., having a doping concentration greater than $10^{15}$ dopants/cm$^3$, between $10^{15}$ dopants/cm$^3$ and $10^{21}$ dopants/cm$^3$, or any value within such ranges).

The engineered substrate 302 may further include an oxide layer 314 on top of the second silicon device layer 310, which oxide layer 314 may function as a passivation layer in some embodiments and, as shown, may be patterned to be absent over the cavities 306. Contacts 324, described further below, and passivation layer 330 may be included on the engineered substrate. The passivation layer 330 may be formed of any suitable passivating material. In some embodiments, the passivation layer 330 is formed of $Si_3N_4$ and in some embodiments is formed by a stack of $SiO_2$ and $Si_3N_4$, although alternatives are possible. Passivation layer 330 may be removed in correspondence to the plurality of cavities 306 (as shown in FIG. 3A), or may be retained to cover some or all of the plurality of cavities 306 (as shown in FIG. 3E). In some embodiments, multiple passivation layers may be retained over the cavities. In some embodiments, one or more insulating layers may be formed within the cavities to optimize device capacitance, to reduce charging, to optimize bias voltage and/or collapse voltage, and/or to improve device reliability. These insulating layers may be patterned in any suitable way within the cavities.

The engineered substrate 302 and CMOS wafer 304 are bonded together at bond points 316a and 316b. The bond points may be formed as thermocompression bonds of a layer on engineered substrate 302 with a layer on CMOS wafer 304 (e.g., metal-to-metal thermocompression bonding), or alternatively may be any other suitable bond type described herein (e.g., a silicide bond, solder bond or eutectic bond). In some embodiments, the bond points 316a and 316b may be conductive, for example being formed of metal. The bond points 316a may function solely as bond points in some embodiments, and in some embodiments may form a seal ring, for example hermetically sealing the ultrasonic transducers of the device 300. In some embodiments, the bond points 316a may define a seal ring that also provides electrical connection between the engineered substrate 302 and the CMOS wafer 304. Similarly, the bond points 316b may serve a dual purpose in some embodiments, for example serving as bond points and also providing electrical connection between the ultrasonic transducers of the engineered substrate 302 and the IC of the CMOS wafer 304.

It is noted that two bond points 316b are illustrated corresponding to each of the six illustrated cavities 306. For example, referring to the ultrasonic transducer 332, two bond points 316b are shown in this cross-sectional view. In some embodiments, not all ultrasonic transducers of the device 300 need have multiple bond points 316b, and when multiple bond points 316b are provided for a given ultrasonic transducer, more than two may be provided, an example being shown in connection with FIG. 3C, which is described in further detail hereinafter. Bond points 316a and 316b may have any suitable shape and size. In some embodiments, all the bond points 316a and 316b have the same size. In other embodiments, different bond points 316a and 316b have different sizes (e.g., different diameters). Spacing between bond points may be uniform or may be varied.

Referring still to FIG. 3A, the CMOS wafer 304 includes a base layer (e.g., a bulk silicon wafer) 318, an insulating layer 320, and a metallization layer 322. The metallization layer 322 may be formed of aluminum, copper, or any other suitable metallization material, and may represent at least part of an integrated circuit formed in the CMOS wafer. For example, metallization layer 322 may serve as a routing layer, may be patterned to form one or more electrodes, or may be used for other functions. In practice, the CMOS wafer 304 may include multiple such metallization layers and/or post-processed redistribution layers, but for simplicity only a single metallization layer is illustrated. Examples of such multiple metals in a stack may include, but are not limited to, for example, copper (Cu), titanium nitride (TiN), aluminum copper (AlCu), aluminum (Al), titanium tungsten (TiW), gold (Au), nickel (Ni), tin (Sn), platinum (Pt), titanium (Ti), tantalum (Ta), as well as combinations and alloys thereof.

The bond points 316b, and in some embodiments 316a as well, may provide electrical connection between the metallization 322 of CMOS wafer 304 and the first silicon device layer 308 of the engineered substrate. In this manner, the integrated circuitry of the CMOS wafer 304 may communicate with (e.g., send electrical signals to and/or receive electrical signals from) the ultrasonic transducer electrodes and/or membranes of the engineered substrate. The multiple bond points 316b for a given ultrasonic transducer may be electrically connected, and thus as shown may contact a common pad of the metallization layer 322. In other cases, some of the bond points may be electrically connected and some electrically isolated, serving only as mechanical supports.

Depending on the material used to form bond points 316a and 316b, additional materials may be provided to serve as seed layers, adhesion layers, and/or liner layers. For example, seed layers 366 and 370 may be provided for the bond points 316a and 316b. As an example, the bond points 316a and 316b may be thermocompression bond points formed by placing some amount of material on each of the engineered substrate 302 and CMOS wafer 304 and then bonding those together. Of course, alternative bonding methods may be used (including, among other methods, bonding using polysilicon and/or doped polysilicon). The seed layers 366, 370, may be used to facilitate formation of the bonding material (e.g., by providing a plating layer for the bonding material) on the CMOS substrate 304 and the engineered substrate 302, respectively, prior to bonding.

Electrical contact to the ultrasonic transducer membranes represented by second silicon device layer 310 is provided in this non-limiting example by contacts 324, which may be formed of metal or any other suitable conductive contact material. Depending on the material used, an adhesion layer may additionally be provided. In the illustrated example, the contact 324 may contact both the second silicon device layer 310 and a portion of the first silicon device layer 308 that is electrically isolated from other portions of the first silicon device layer 308 corresponding to the transducer regions. In some embodiments, an electrical connection may be provided between the contacts 324 and the bond pad 326 on the CMOS wafer. In other embodiments an embedded via (not shown) may be provided from the first silicon device layer 308 to a bottom side of the second silicon device layer 310, thus obviating any need for the contacts 324 on the topside of the second silicon device layer 310. It should be appreciated that, while FIG. 3A illustrates a single contact 324 and a single contact 326, multiple contacts 324 may be provided that provide electrical access to engineered substrate 302 and/or multiple contacts 326 may be provided that provide electrical access to CMOS wafer 304.

The first silicon device layer 308 of the engineered substrate also includes isolation structures (e.g., isolation trenches) 328 configured to electrically isolate individual ultrasonic transducers. The isolation structures 328 may include trenches formed through the first silicon device layer 308 that are filled with an insulating material. Alternatively, the isolation structures 328 may be defined by suitable doping of the first silicon device layer 308. As described in further detail below, regions between electrically isolated transducer regions of the first silicon device layer 308 may represent acoustically inactive, or dead space regions of the engineered substrate 302, in which such acoustically inactive regions are nonetheless also connected by bond points to the CMOS wafer 304.

As further shown in FIG. 3A, the device 300 may optionally include flow stop features 360 formed of any suitable material such as, for example silicon dioxide or silicon nitride. A passivation layer 362 may also optionally be formed on the CMOS wafer and may be, for example, an oxide layer. Passivation layer 362 may serve as a hermetic protection layer, as a layer for the planarization of the CMOS wafer 304 during the CMP process, and/or as an etch stop for the MEMS integration. Another passivation layer 364 may also optionally be included, and may be, for example, a nitride layer. The layer 364 may be formed by plasma enhanced chemical vapor deposition (PECVD), as an example.

Various features of the device 300 are now noted. For instance, it should be appreciated that the engineered substrate 302 and CMOS wafer 304 may be monolithically integrated at the wafer level, thus providing for low cost monolithic integration of ultrasonic transducers with CMOS ICs. In the illustrated embodiment, the ultrasonic transducers are positioned vertically (or stacked) relative to the CMOS IC, which may facilitate formation of a compact ultrasound device by reducing the chip area required to integrate the ultrasonic transducers and CMOS IC.

Additionally, the engineered substrate 302 includes only two silicon layers 308 and 310, with the cavities 306 being formed between them. The first silicon device layer 308 and second silicon device layer 310 may be thin, for example each being less than 50 microns in thickness, less than 30 microns in thickness, less than 20 microns in thickness, less than 10 microns in thickness, less than 5 microns in thickness, less than 3 microns in thickness, or approximately 2 microns in thickness, among other non-limiting examples. Such dimensions contribute to achieving a small device and may facilitate making electrical contact to the ultrasonic transducer membrane (e.g., second silicon device layer 310) without the need for TSVs. TSVs are costly to implement, requiring specialty equipment and long process times and thus avoiding use of them may increase manufacturing yield and reduce device cost. Moreover, forming TSVs requires special fabrication tools not possessed by many commercial semiconductor foundries, and thus avoiding the need for such tools can improve the supply chain for forming the devices, making them more commercially practical than if TSVs were used. TSVs may further prevent the integration of features with high densities or small sizes, thereby limiting the design options.

The engineered substrate 302 as shown in FIG. 3A may be relatively thin, for example being less than 100 microns (μm) in total thickness, less than 50 μm in total thickness, less than 30 μm in total thickness, less than 20 μm in total thickness, less than 10 μm in total thickness, between 10 and 500 μm in thickness, or any value or range of values within such ranges. Because such thin dimensions can represent a lower structural integrity for certain types of microfabrication processes, such as those performed at a wafer level using a wafer chuck, it is noteworthy that such thin dimensions may be achieved in the device 300.

Also, the silicon device layers 308 and 310 may be formed of single crystal silicon. The mechanical and electrical properties of single crystal silicon are understood, and thus the use of such materials in an ultrasonic transducer (e.g., as the membrane of a CMUT) may facilitate design and control of the ultrasonic transducer behavior. As a result, scaling to high volume manufacturing may be facilitated.

Another feature worth noting is that there is a gap 372 between parts of the CMOS wafer 304 and the first silicon device layer 308 since the two are bonded at discrete bond points 316a, 316b rather than by a bond covering the entire surface of the CMOS wafer 304. The significance of this gap is that the first silicon device layer 308 may vibrate if it is sufficiently thin. Such vibration may be undesirable in some embodiments, for instance representing unwanted vibration in contrast to the desired vibration of the second silicon device layer 310. Accordingly, it is beneficial in at least some embodiments for the first silicon device layer 308 to be sufficiently thick to minimize or avoid such vibration, such as being at least 4 μm thick, at least 10 μm thick, between 10 and 500 μm thick, or any value or range of values within such ranges.

In alternative embodiments, it may be desirable for both the first and second silicon device layers 308 and 310 to vibrate. For instance, they may be constructed to exhibit different resonance frequencies, thus creating a multi-frequency device. The multiple resonance frequencies (which may be related as harmonics in some embodiments) may be used, for example, in different operating states of an ultrasound transducer. For example, the first silicon device layer 308 may be configured to resonate at half the center frequency of the second silicon device layer 310.

The cavities 306 may have suitable dimensions, such as a suitable width W, corresponding to a dimension of the membrane of the ultrasonic transducer, as further illustrated in FIG. 3A. The width dimension may also be used to identify the aperture size of the cavity. Widths W of approximately 50 μm, between approximately 5 μm and approximately 500 μm, between approximately 20 μm and approximately 100 μm, any width or range of widths in between, or any other suitable widths. In some embodiments, the width W may be selected to maximize the void fraction fill factor, being the amount of area consumed by the cavities compared to the amount of area consumed by surrounding structures.

It should be appreciated that cavities 306 may have any suitable shape. Non-limiting examples includes round (circular), hexagonal, octagonal, and rectangular-shaped cavities. However, other polygonal shapes, or other shapes more generally, are possible.

The device 300 may be fabricated using multiple bonding steps. For example, the engineered substrate 302 may be formed by bonding together two silicon wafers or SOI wafers, or a combination thereof, to create the sealed cavities 306. For example, the bonding may involve forming a $SiO_2$—$SiO_2$ bond or Si—$SiO_2$. The bonding may be followed by a high temperature anneal to provide a high quality bond strength. An example of a technique for forming the engineered substrate is described in U.S. Pat. No. 9,067,779 and U.S. Patent Application Publication 2016/0009544, both of which are incorporated herein by reference in their entireties.

Bonding and annealing of the engineered substrate 302 occurs prior to its integration with the CMOS wafer 304. Thus, high temperature processing is possible during formation of the engineered substrate 302. High temperature processing of the engineered substrate 302 is also enabled by the use of highly doped silicon 308 as a lower electrode material. Metal is not present in the engineered substrate 302 when the transducer cavities 306 are formed. As such, the ability to form the transducer cavities 306 in the engineered substrate 302 using high temperature processes results in a highly reliable device. The oxide 312 that forms the cavities is a thermally grown oxide. This is a dense oxide without impurities or trapped charge, and forms a strong bond with the silicon membrane of the transducer. The resultant device is repeatable and reliable, and not prone to delamination (as is common in CMUTs formed with low temperature oxides and low temperature cavity bond). The resultant device can be operated with high voltage bias without charging effects because of the high quality thermal oxide. Thus, the approach of using an engineered substrate with thermal oxide and highly doped silicon is a novel approach, enabling manufacturable and reliable CMUT devices, which can be readily integrated with CMOS or other electrical substrates (including wafers, dies, interposers, printed circuit boards, or reconstructed substrates such as fan-in or fan-out wafer level packages). This approach enables independent optimization and revision of the engineered substrate 302 and CMOS wafer 304. For example, CMOS wafers and engineered substrates may be prepared and/or held in separate inventories, thus enabling optimization of inventory management based on one or more business variables, such as operating capital, cycle time, delivery lead time, engineering, quality, risk mitigation, resource utilization, and/or new product development lead time.

The CMOS wafer 304 may have an IC fabricated thereon using standard IC fabrication techniques. The CMOS wafer 304 and engineered substrate may be bonded together using eutectic bonding, thermocompression, silicide bonding, or any other suitable bonding technique, which in at least some embodiments may be a bonding technique performed at sufficiently low temperature to avoid damaging the IC on the CMOS wafer 304. Such temperatures may be less than 450° C. in some embodiments. Suitable examples of such bonding are described in U.S. Pat. No. 9,067,779 and U.S. Patent Application Publication 2016/0009544.

Figure 3B:
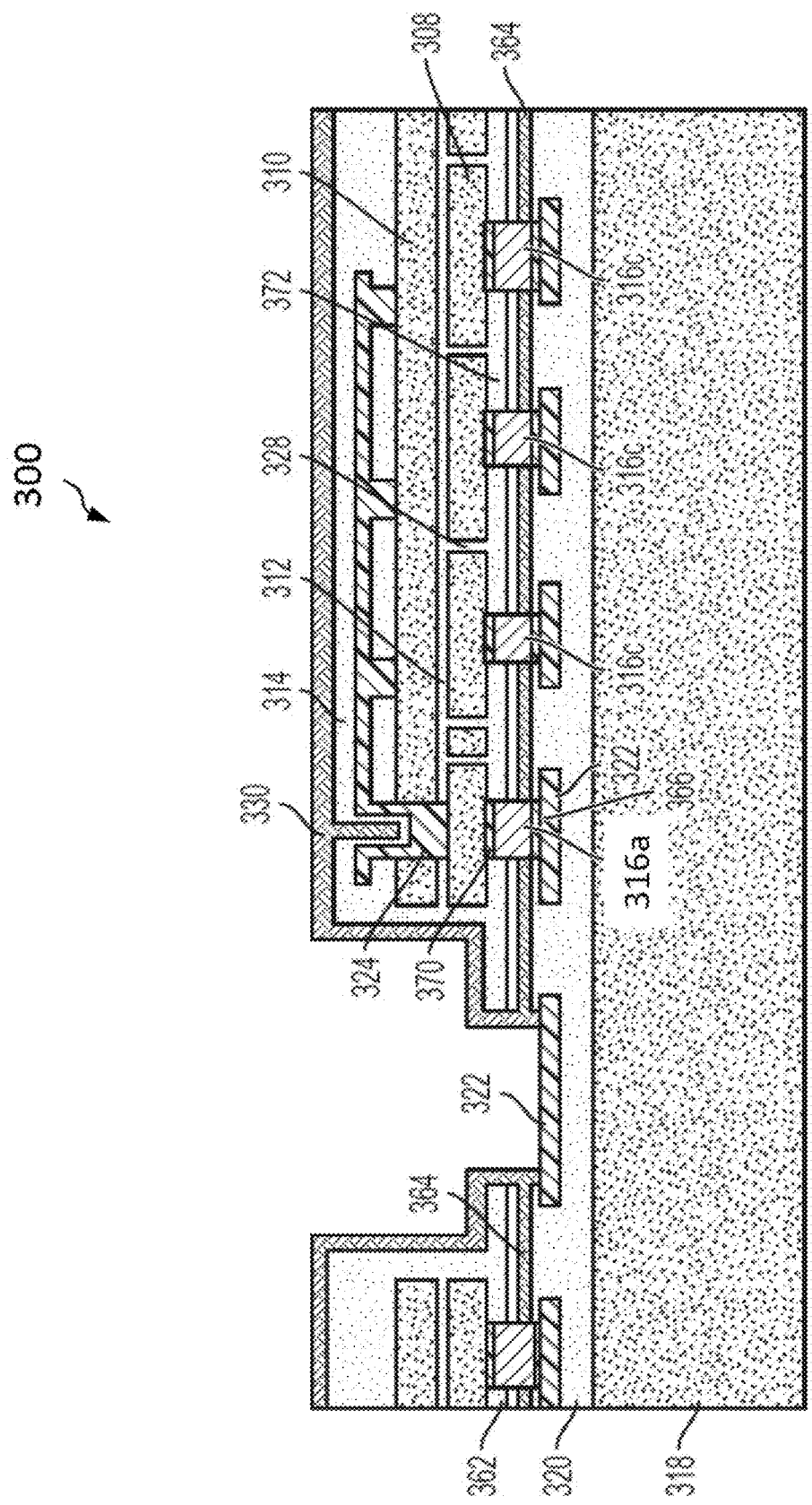
FIG. 3B is another cross-sectional view taken along the line B-B in FIG. 3C, illustrating a dead space region between active transducers of the ultrasound-on-a-chip device, according to a non-limiting embodiment of the present application.

FIG. 3B illustrates a different cross-sectional view of the device 300 where, in some embodiments, an electrical connection is provided between acoustically inactive, or dead space regions of the engineered substrate 302 and the CMOS wafer 304. In some such embodiments, an electrical connection is provided between an acoustically inactive portion of the same layer 308 that forms the bottom electrode of the ultrasonic transducers, and an IC on the CMOS wafer 304, such as contacts 316c. As will be noted from FIG. 3B, the contacts 316c to the first silicon device layer 308 corresponding to regions where there are no cavities formed in the silicon oxide layer 312 (i.e., the acoustically inactive regions).

Figure 3C:
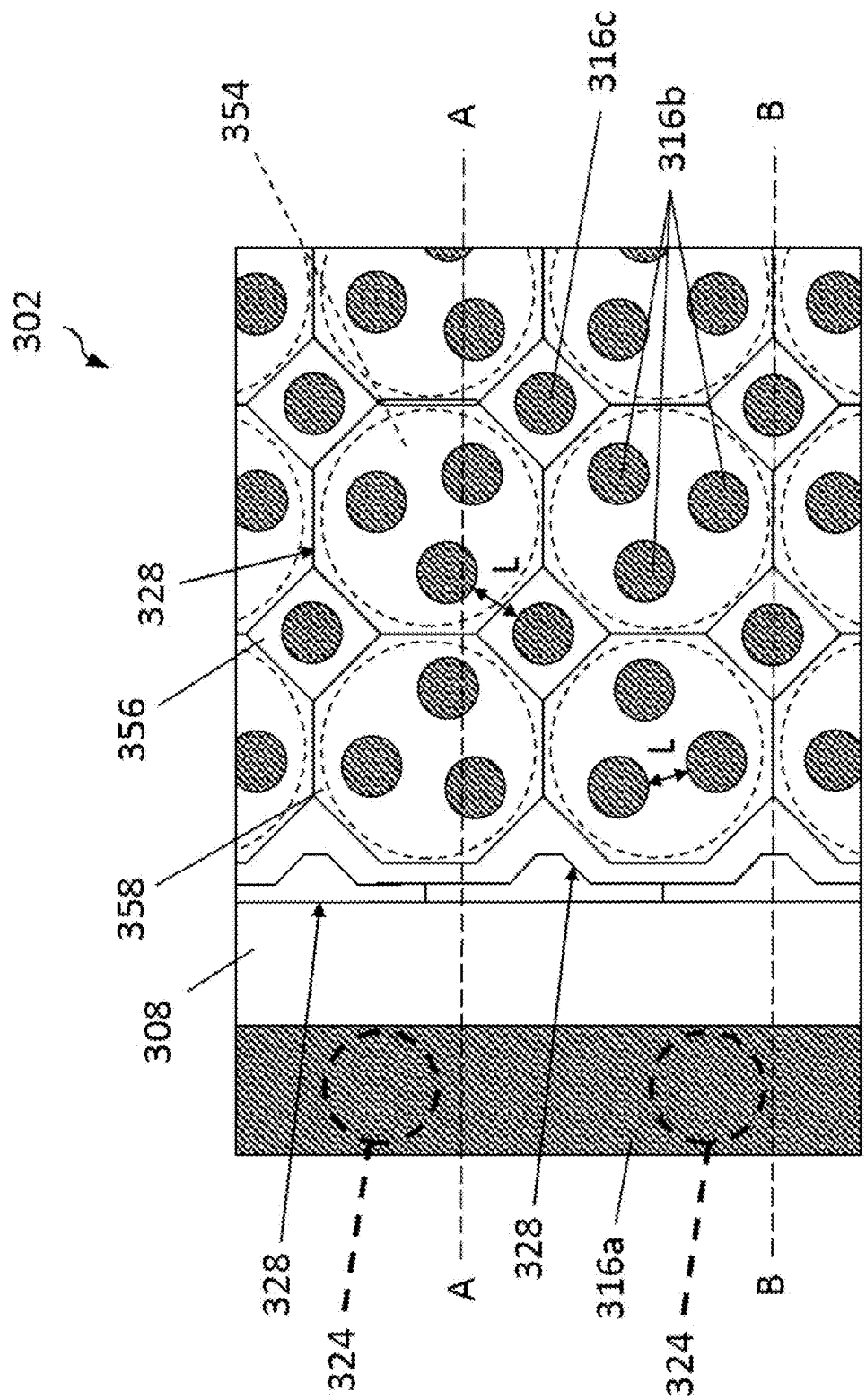
FIG. 3C is a bottom-up view taken along the arrows "C" of FIG. 3A illustrating an example of a configuration of conductive contacts to the first silicon device layer of the engineered substrate, including regions corresponding to both the ultrasonic transducer cavities and acoustically inactive dead spaces, according to a non-limiting embodiment of the present application.
Figure 3E:
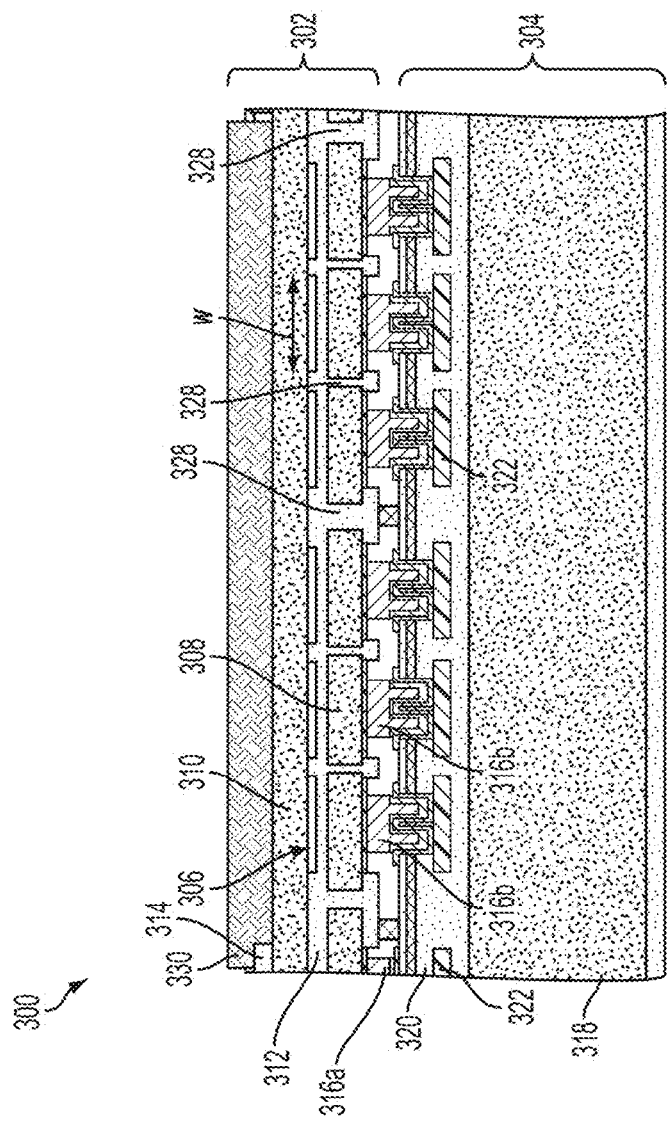
FIG. 3E is a cross sectional view illustrating a portion of an ultrasound-on-a-chip device wherein the passivation layer(s) remains over the cavities of the micromachined ultrasonic transducers, according to a non-limiting embodiment of the present application.

Referring now to FIG. 3C, a bottom-up view of the engineered substrate 302 taken along the arrows "C" of FIG. 3A is shown. More specifically, FIG. 3C illustrates an example of a configuration of conductive contacts to the first silicon device layer 308 of the engineered substrate 302, including regions of the first silicon device layer 308 corresponding to both the ultrasonic transducer cavities (dashed circle regions 354) and acoustically inactive dead spaces (regions 356). As is shown, a plurality of octagonal regions 358 is defined in the first silicon device layer 308 by isolation structures 328 (e.g., a trench having an oxide liner and polysilicon fill). The octagonal regions 358, which are electrically isolated from one another and from the acoustically inactive dead spaces 356, are acoustically active regions of the first silicon device layer 308, in that they correspond to locations of the ultrasonic transducer cavities 354. Conversely, regions 356, are acoustically inactive regions of the first silicon device layer 308, in that they do not correspond to locations of the ultrasonic transducer cavities 354.

As further shown in FIG. 3C, metal bond points 316a, 316b and 316c connect to the first silicon layer 308. It will be noted that, for purposes of clarity, the seed layer(s) 370 shown in FIGS. 3A and 3B are omitted from FIG. 3C, although it will be understood that such layers may be used to bond the metal material 316a, 316b and 316c to the first silicon layer 308. Whereas multiple bond points 316b are used to connect to the acoustically active regions 358 of the highly doped first silicon layer 308 to define an electrode, a single bond point 316c is used to connect to each of the acoustically inactive regions 356. In addition to electrically isolating individual transducer regions in the first silicon layer 308, the isolation structures 328 may also be used to electrically isolate the seal ring 316a from the transducer array. For additional clarity, the positional relationship of a pair of the plurality of contacts 324 (described above in conjunction with FIG. 3A) that contact the opposite side of the first silicon layer 308, is also shown in FIG. 3C.

In the exemplary embodiment depicted, each individual transducer (i.e., each acoustically active region 358) includes three bond points 316b that are substantially uniformly positioned with respect to an area of the transducer cavity 354. The use of multiple bond points 316b to contact an individual acoustically active region 358, rather than using a larger single contact point, may improve bonding between the engineered substrate 302 and the CMOS wafer 304 because bonding to smaller contact points may be easier to achieve through standard microfabrication processing. Additionally, or alternatively, the use of multiple bond points 316b to contact an individual acoustically active region 358 may lower costs due to a reduction in the amount of material used for the bonding and/or due to shorter processing times (e.g., shorter times in the plating of metal features, optimization of fabrication processes such as CMP, lithography, plating and etch, and optimization of mechanical properties).

The dead space contacts 316c may provide several advantages including, for example, a mechanical support for larger dead space spans. In a configuration where a transducer cell diameter increases from about 48 μm to about 96 μm (such that a transducer element arrangement changes from 4×4 cells per element to 2×2 cells per element), there is a change in packing density of the cells leading to larger dead space reasons between the trench isolated transducer cells. In addition, the dead space contacts 316c may be used to ground or bias the non-active areas of the silicon for reduced parasitic capacitance and noise. That is, the contacts 316c help to provide an electrical baseline against which to compare signals detected on contacts 316b. For example, the dead space regions may experience similar or the same electrical noise as the ultrasonic transducers. Thus, by collecting a signal specific to such noise from contact 316c, that signal may be processed in combination with signals from contacts 316b to determine a contribution of the signals on contacts 316b that is attributable to acoustic behavior compared to electrical noise. Such processing may include subtracting, averaging, or other suitable combinations. In this manner noise, such as parasitic capacitance, may be removed resulting in improved signal-to-noise ratio (SNR). As further described below with respect to the metal of the CMOS wafer, the uniform pattern distribution of metal features on the top aluminum layer also helps to maintain good planarity results through CMOS CMP.

In some embodiments, the cells 204a-204d may each have a size (e.g., a diameter) that is between 10 μm and 250 μm, between 175 μm and 225 μm, between 190 μm and 200 μm, between 194 μm and 198 μm, between 195 μm and 197 μm, between 25 μm and 75 μm, between 40 μm and 60 μm, between 75 μm and 125 μm, between 75 μm and 100 μm, between 90 μm and 102 μm, between 94 μm and 98 μm, or between any other suitable range within such ranges. In some embodiments, the cells 204a-d may each have a size (e.g., a diameter) that is equal to 196 μm. In some embodiments, the cells may have non-uniform sizes, with one or more of the cells having sizes within the ranges listed above.

As will be appreciated, the yield for forming a device such as device 300 may be greater by using multiple bond points 316b per individual transducer as opposed to a single, larger contact point per transducer. Also, by using multiple bond points 316b to contact an acoustically active region 358, the distance L between nearest neighboring bond points 316b and 316c at any given location may be shorter with respect to having just a single contact of comparable size made to each acoustically active region 358. By keeping the distance L small (e.g., 100 μm or less), the uniformity of spacing of all features on the bonding layer is maximized, and the mechanical integrity of the ultrasound device 300 may be improved. Because there is a gap between the engineered substrate 302 and the CMOS wafer 304 (spanned by the bond points 316a, 316b and 316c), small distance between bond points 316b and 316c of neighboring ultrasonic transducers small amounts to providing greater mechanical support to the suspended engineered substrate 302. Of course, other bonding arrangements may be used including single contact points per transducer. In some embodiments, a combination of large contacts and smaller contacts may be used. For example, a large contact may be used on one portion of the substrate and smaller, multiple contacts may be used on another portion of the substrate.

Referring to FIG. 3D, a top-down view of the CMOS wafer 304 taken along the arrows "D" of FIG. 3A is shown. More specifically, FIG. 3D illustrates illustrating the location of conductive contacts (bond points 316a, 316b and 316c) in both FIG. 3A and FIG. 3B with respect to metal regions 322 of the CMOS wafer 304, according to a non-limiting embodiment of the present application. As can be seen from FIG. 3D, the CMOS metal regions 322 include larger circular regions 380 corresponding to individual transducer cells of the engineered substrate contacted by multiple bond points 316b, smaller circular regions 382 corresponding to dead space regions of the engineered substrate contacted by single bond points 316c, and region 384 contacted by seal ring 316a.

In order to enable noise reduction as mentioned previously by contacting non-acoustically active silicon and holding it at a set potential, CMOS metal 322 may also be patterned to connect regions 382 in a grid like fashion. Similarly, in order to group individual transducer cells as a functioning ultrasound element (e.g., a 2×2 ultrasound element), CMOS metal 322 may also be patterned to electrically connect groups of metal regions 380 together. In the example depicted in FIG. 3D, groups of four metal regions 380 are electrically connected with one another in the CMOS wafer. As also shown, the metal regions 380 are further patterned with openings 386 at a center portion thereof. The openings 386 are another feature that may help improve the planarization (flatness) of the CMOS surface by preventing dishing during CMP that may otherwise occur on large metal regions.

The aspects of the present application may provide one or more benefits, some of which have been previously described. Described are some non-limiting examples of such benefits. It should be appreciated that not all aspects and embodiments necessarily provide all of the benefits now described. Further, it should be appreciated that aspects of the present application may provide additional benefits to those now described.

Aspects of the present application provide manufacturing processes suitable for formation of monolithically integrated ultrasonic transducers and CMOS structures (e.g., CMOS ICs) or other electrical substrates, such as analog ICs (which may include high speed links to digital off-chip circuits), interposers (e.g., silicon interposers), and printed circuit boards. Thus, single substrate devices operating as ultrasound devices (e.g., for ultrasound imaging and/or high intensity focused ultrasound (HIFU)) are achieved. These manufacturing process may be performed at a wafer-level, for example by tiling CMUT designs, or at die-level.

In at least some embodiments, the processes may be reliable (e.g., characterized by high yield and/or high device reliability), scalable to large quantities, and relatively inexpensive to perform (due to, e.g., wafer level integration), thus contributing to a commercially practical fabrication process for CUTs. The use of complex and costly processing techniques such as the formation of TSVs, the use of stringent requirement CMP, and the use of densification anneals of low temperature oxide bonds may be avoided. Moreover, the processes may provide for the fabrication of small ultrasound devices, facilitating the creation of portable ultrasound probes.

Aspects of the present application provide for the ability to tune transmit and/or receive frequencies of the ultrasonic transducers, thus enabling for the use of single probes that can be used in different modes and/or applications. For example, multiple different imaging modes may be implemented with the same ultrasonic transducers by tuning their transmit and/or receive frequencies. In this way, the need for multiple probes to cover the full range of imaging modalities (e.g., medical imaging modalities from superficial to deep imaging) may be eliminated, thus lowering costs and improving probe portability.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application.

The following illustrate non-limiting aspects and applications of the instant disclosure. Example 1 is directed to an apparatus, comprising: an ultrasound-on-a-chip device comprising an ultrasonic transducer substrate having plurality of individual transducer cells disposed proximate a first side of the ultrasonic transducer substrate; and for at least one transducer cell, one or more conductive bond connections disposed between a second side of the ultrasonic transducer substrate and an electrical substrate.

Example 2 is directed to the apparatus of Example 1, wherein the one or more conductive bond connections are distributed substantially evenly with respect to an area of a transducer cell of the plurality of transducer cells.

Example 3 is directed to the apparatus of any preceding example, wherein the one or more conductive bond connections comprise one or more of: thermal compression connections, eutectic connections and silicide connections.

Example 4 is directed to the apparatus of any preceding example, wherein the one or more conductive bond connections contact a conductive portion of a silicon layer of the ultrasonic transducer substrate at a first end thereof, and a metal layer of the electrical circuit substrate at a second end thereof.

Example 5 is directed to the apparatus of any preceding example, further comprising a single conductive bond connection connected to at least one acoustically inactive region of a plurality of acoustically inactive regions of the ultrasonic transducer substrate, each single conductive bond connection disposed between the ultrasonic transducer substrate and the integrated circuit substrate.

Example 6 is directed to the apparatus of any preceding example, wherein the plurality of acoustically inactive regions of the ultrasonic transducer substrate are disposed between adjacent pairs of individual transducer cells.

Example 7 is directed to the apparatus of any preceding example, wherein the plurality of transducer cells are electrically isolated from one another on a conductive portion of a silicon layer of the ultrasonic transducer substrate by isolation trenches formed in the silicon layer.

Example 8 is directed to the apparatus of any preceding example, wherein the isolation trenches form octagonal regions corresponding to plurality of transducer cells.

Example 9 is directed to the apparatus of any preceding example, wherein the acoustically inactive regions are defined by a border between four adjacent octagonal regions.

Example 10 is directed to the apparatus of any preceding example, wherein one or more bond connections is separated from a nearest neighbor bond connection by a distance of about 100 microns (µm) or less.

Example 11 is directed to an ultrasound device, comprising: a composite substrate comprising first and second substrates bonded together to define a plurality of cavities therebetween, each cavity corresponding to an individual ultrasound transducer cell; and an electrical substrate bonded to the composite substrate by a plurality of conductive bond points, wherein each transducer cell has multiple conductive bond connections disposed between the ultrasonic transducer substrate and the electrical substrate.

Example 12 is directed to the ultrasound device of Example 11, wherein the plurality of conductive bond connections further comprise, in addition to the one or more conductive bond connections for each transducer cell: a single conductive bond connection connected to each of a plurality of acoustically inactive regions of the composite substrate; and one or more seal rings surrounding an ultrasonic transducer array defined by the plurality of ultrasound transducer cells.

Example 13 is directed to the ultrasound device of any preceding example, wherein the one or more conductive bond connections comprise one or more of: thermocompression connections, eutectic connections, solder connections, and silicide connections.

Example 14 is directed to the ultrasound device of any preceding example, wherein: the first substrate of the composite substrate corresponds to a membrane of the transducer array; the second substrate of the composite substrate is bonded to the integrated circuit substrate by the plurality of conductive bond connections; and the seal ring provides an electrical connection between the first substrate and the electrical substrate, via a portion of the second substrate that is electrically isolated from bottom electrode contacts of the transducer array. Additionally, or alternatively, the seal ring may create a hermetic seal around the underside of the transducer array, thus preventing moisture ingression during processing or use, thereby facilitating manufacturing of reliable devices.

Example 15 is directed to the ultrasound device of any preceding example, wherein the transducer cells are electrically isolated from one another on a conductive portion of a silicon layer of the second substrate by isolation trenches formed in the silicon layer.

Example 16 is directed to the ultrasound device of any preceding example, wherein the isolation trenches form octagonal regions corresponding to individual transducer cells.

Example 17 is directed to the ultrasound device of any preceding example, wherein the acoustically inactive regions are defined by a border between four adjacent octagonal regions.

Example 18 is directed to the ultrasound device of any preceding example, further comprising additional isolation trenches formed on the silicon layer of the second substrate, the additional isolation trenches electrically insulating a portion of the second substrate contacted by the seal ring from the octagonal regions.

Example 19 is directed to the ultrasound device of any preceding example, wherein the multiple conductive bond connections for each individual transducer cell, the single conductive bond connection connected to each of a plurality of acoustically inactive regions of the composite substrate, and the seal ring contact the conductive portion of a silicon layer of the composite substrate at a first end thereof, and a metal layer of the electrical substrate at a second thereof.

Example 20 is directed to the ultrasound device of any preceding example, wherein the metal layer of the integrated circuit comprises: first metal regions to which the multiple conductive bond connections are connected; second metal regions to which each single conductive bond connection is connected; and a third metal region to which the seal ring is connected.

Example 21 is directed to the ultrasound device of any preceding example, wherein the first metal regions comprise circular regions having an opening patterned at a center portion thereof.

Example 22 is directed to the ultrasound device of any preceding example, wherein groups of first metal regions are electrically connected together so as to group individual transducer cells as a single functioning ultrasound element.

Example 23 is directed to the ultrasound device of any preceding example, wherein the second metal regions are electrically connected in a grid like fashion.

Example 24 is directed to the ultrasound device of any preceding example, wherein each multiple bond connection is separated from a nearest neighbor bond connection by a distance of about 100 microns ($\mu$m) or less.

Example 25 is directed to the ultrasound device of any preceding example, wherein the multiple bond connections comprise three bond connections.

Example 26 is directed to a method of forming an ultrasound device, the method comprising: bonding first and second substrates bonded together to define a composite substrate having a plurality of cavities therein, each cavity corresponding to an ultrasound transducer cell; and bonding an electrical substrate to the composite substrate with a plurality of conductive bond points, wherein each transducer cell has multiple conductive bond connections disposed between the ultrasonic transducer substrate and the integrated circuit substrate.

Example 27 is directed to the method of Example 26, further comprising, in addition to the multiple conductive bond connections for each transducer cell: forming a single conductive bond connection connected to each of a plurality of acoustically inactive regions of the composite substrate; and forming a seal ring that surrounds an ultrasonic transducer array defined by the plurality of ultrasound transducer cells.

Example 28 is directed to the method of any preceding example, wherein forming the multiple conductive bond connections comprises forming one or more of: thermocompression connections, eutectic connections and silicide connections.

Example 29 is directed to the method of any preceding example, further comprising: bonding the second substrate of the composite substrate to the electrical substrate with the plurality of conductive bond connections; and establishing, with the seal ring, an electrical connection between the first substrate and the integrated circuit substrate, via a portion of the second substrate that is electrically isolated from bottom electrode contacts of the transducer array, wherein the first substrate of the composite substrate corresponds to a membrane of the transducer array.

Example 30 is directed to the method of any preceding example, further comprising electrically isolating the individual transducer cells from one another on a conductive portion of a silicon layer of the second substrate by forming isolation trenches in the silicon layer.

Example 31 is directed to the method of any preceding example, wherein the isolation trenches form octagonal regions corresponding to individual transducer cells.

Example 32 is directed to the method of any preceding example, wherein the acoustically inactive regions are defined by a border between four adjacent octagonal regions.

Example 33 is directed to the method of any preceding example, further comprising forming additional isolation trenches on the silicon layer of the second substrate, the additional isolation trenches electrically insulating a portion of the second substrate contacted by the seal ring from the octagonal regions.

Example 34 is directed to the method of any preceding example, wherein each multiple bond connection is separated from a nearest neighbor bond connection by a distance of about 100 microns (μm) or less.

Example 35 is directed to the method of any preceding example, wherein the multiple bond connections comprise three (3) bond connections.

Example 36 is directed to an ultrasound apparatus, comprising: an ultrasound probe; and an ultrasound-on-a-chip device disposed within the probe, the ultrasound-on-a-chip device comprising the apparatus of any preceding example.

As a non-limiting example, various embodiments have been described as including CMUTs. In alternative embodiments, piezoelectric micromachined ultrasonic transducers (PMUTs) may be used instead of, or in addition to, CMUTs. In some embodiments, the methods of fabrication described herein may be used to form ultrasound devices that include PMUTs in addition to, or as an alternative to, CMUTs. This may be facilitated by the fact that PMUTs may be formed with temperatures comparable to those used in the fabrication of engineered substrate 302.

What is claimed is:

1. An apparatus, comprising:
   an ultrasound-on-a-chip device comprising an ultrasonic transducer substrate having a plurality of transducer cells disposed proximate a first side of the ultrasonic transducer substrate;
   for at least one transducer cell, one or more conductive bond connections disposed between a second side of the ultrasonic transducer substrate and an electrical substrate; and
   a single conductive bond connection connected to at least one acoustically inactive region of a plurality of acoustically inactive regions of the ultrasonic transducer substrate, each single conductive bond connection disposed between the ultrasonic transducer substrate and the electrical substrate.

2. The apparatus of claim 1, wherein the one or more conductive bond connections are distributed substantially evenly with respect to an area of a transducer cell of the plurality of transducer cells.

3. The apparatus of claim 1, wherein the one or more conductive bond connections comprise one or more of: thermal compression connections, eutectic connections and silicide connections.

4. The apparatus of claim 1, wherein the one or more conductive bond connections contact a conductive portion of a silicon layer of the ultrasonic transducer substrate at a first end thereof, and a metal layer of the electrical substrate at a second end thereof.

5. The apparatus of claim 1, wherein the plurality of acoustically inactive regions of the ultrasonic transducer substrate are disposed between adjacent pairs of transducer cells of the plurality of transducer cells.

6. The apparatus of claim 5, wherein the plurality of transducer cells are electrically isolated from one another on a conductive portion of a silicon layer of the ultrasonic transducer substrate by isolation trenches formed in the silicon layer.

7. The apparatus of claim 6, wherein the isolation trenches form octagonal regions corresponding to individual transducer cells of the plurality of transducer cells.

8. The apparatus of claim 7, wherein the acoustically inactive regions are defined by a border between four adjacent octagonal regions.

9. The apparatus of claim 1, wherein each of the one or more bond connections is separated from a nearest neighbor bond connection by a distance of about 100 microns (μm) or less.

10. The apparatus of claim 1, wherein the ultrasonic transducer substrate and the electrical substrate are bonded together to define a plurality of cavities between them.

11. The apparatus of claim 10, wherein each of the plurality of transducer cells corresponds to a cavity of the plurality of cavities.

12. The apparatus of claim 1, further comprising a seal ring surrounding an ultrasonic transducer array defined by the plurality of transducer cells.

13. The apparatus of claim 12, wherein the seal ring provides an electrical connection between the ultrasonic transducer substrate and the electrical substrate.

14. The apparatus of claim 1, further comprising a probe, wherein the ultrasound-on-a-chip device is disposed within the probe.

* * * * *